(12) United States Patent
Choi

(10) Patent No.: US 7,572,694 B2
(45) Date of Patent: Aug. 11, 2009

(54) METHOD OF MANUFACTURING A SEMICONDUCTOR DEVICE

(75) Inventor: Chee-Hong Choi, Seoul (KR)

(73) Assignee: Dongbu HiTek Co., Ltd., Seoul (KR)

( * ) Notice: Subject to any disclaimer, the term of this patent is extended or adjusted under 35 U.S.C. 154(b) by 125 days.

(21) Appl. No.: 11/611,664

(22) Filed: Dec. 15, 2006

(65) Prior Publication Data
US 2007/0145517 A1    Jun. 28, 2007

(30) Foreign Application Priority Data
Dec. 28, 2005    (KR) ................ 10-2005-0131506

(51) Int. Cl.
*H01L 21/8238* (2006.01)
(52) U.S. Cl. ............ 438/233; 438/618; 257/E21.252
(58) Field of Classification Search .......... 257/288, 257/773, 774, E29.116, E21.409, E21.579, 257/E21.582, E21.585; 438/197, 233, 629, 438/637, 639
See application file for complete search history.

(56) References Cited

U.S. PATENT DOCUMENTS 6,255,168 B1 * 7/2001 Gau ................ 438/262

2002/0137319 A1 * 9/2002 Hsu et al. ............ 438/586

FOREIGN PATENT DOCUMENTS

KR    1020000004334    * 1/2000
KR    1020030056911      7/2003

* cited by examiner

*Primary Examiner*—Minh-Load T Tran
*Assistant Examiner*—Selim Ahmed
(74) *Attorney, Agent, or Firm*—Sherr & Vaughn, PLLC

(57) ABSTRACT

A method for manufacturing a semiconductor device includes forming an insulation film over a semiconductor substrate having a conduction layer; forming a trench pattern over the insulation film; etching an upper portion of the insulation film by using the trench pattern as a mask to form a trench; removing the trench pattern; forming a spacer film over the insulation film having the trench; etching the space film to form a spacer by using a blanket etching process, the spacer remaining over an edge of an inner portion of the trench; etching the insulation film to form a via hole by using as a mask the spacer; completely removing the spacer; forming a barrier film over sidewalls of the trench and the via hole; and forming a metal line with which fills inner portions of the trench and the via hole.

11 Claims, 3 Drawing Sheets

METHOD OF MANUFACTURING A SEMICONDUCTOR DEVICE

The present application claims priority under 35 U.S.C. 119 and 35 U.S.C. 365 to Korean Patent Application No. 10-2005-0131506 (Filed Dec. 28, 2005), which is hereby incorporated by reference in its entirety.

BACKGROUND

The disclosure relates to a method for manufacturing a semiconductor device; and, more particularly, to a method for forming a metal line in a semiconductor device.

Generally, metal lines in semiconductor devices are formed by using thin metal films made of Al or Cu, for example. Electrical contacts and pad connections between two semiconductor devices allow circuits formed in a semiconductor substrate to be connected to each other.

Such metal lines may be formed by using a Via-First Dual Damascene process for connecting device electrodes and pads separated by an insulating film such as an oxide layer. The insulating film is selectively etched to form a via hole. A photoresist film is deposited, covering the substrate and filling the via hole. A trench pattern is formed in the insulating film by first exposing and etching the photoresist film. The insulating film is then etched to form a trench by using the trench pattern as a mask. The trench pattern and the filling film are then removed, and the inner portion of the via hole and the inner portion of the trench are filled with a metal film.

When a process like this is used to design a circuit pattern, due to problems related to, for example, the critical dimension or minimum feature size, a photoresist film may be improperly formed. The film should be removed and another photoresist film should be deposited to form another photoresist pattern. Hereinafter, the process of reworking the photoresist pattern as described above will be referred to as a photoresist film rework process.

In a photoresist film rework process, the improperly formed photoresist film is removed. The photoresist film may be removed by a dry etching process or a wet etching process.

However, when an improper trench pattern needs to be removed and a photoresist film rework process is carried out, a particular problem may surface. Not only the improper trench pattern itself but also the thick photoresist layer filling the inner portion of the via hole should be removed.

On a semiconductor substrate in which the trench pattern and the filling film have been removed, residues of the photoresist film may remain through the dry cleaning process and the wet cleaning process. If a photoresist film rework process is then used to form other metal lines and via holes, the residues of the previous photoresist film may cause deformations in the critical dimensions of the vias and lines, thereby degrading the electrical characteristics of the semiconductor devices and reducing the yield of the products.

Moreover, since the photolithography/etching processes are performed twice when the Via-First process is used to form the metal lines, the manufacturing costs for the products may be increased.

SUMMARY

Embodiments relate to a method of manufacturing a semiconductor device which simplifies a photoresist rework process, resulting in the complete removal of a photoresist film with an improper pattern which has been previously made on a semiconductor substrate, thereby improving the electrical characteristics of the semiconductor device and the yield of the products, and reducing manufacturing costs.

Embodiments relate to a method of manufacturing a semiconductor device comprising: forming an insulation film over a semiconductor substrate having a conduction layer; forming a trench pattern over the insulation film using a photoresist film; forming a trench by etching an upper portion of the insulation film using the trench pattern as a mask; removing the trench pattern; forming a spacer film over the insulation film having the trench; etching the spacer film to form a spacer by using a blanket etching process, wherein the spacer remains over an edge of an inner portion of the trench; etching the insulation film to form a via hole by using as a mask a spacer which remains over an edge of an inner portion of the trench; completely removing the spacer; forming a barrier film over sidewalls of the trench and the via hole; and forming a metal line with which fills inner portions of the trench and the via hole.

BRIEF DESCRIPTION OF THE DRAWINGS

Example

DETAILED DESCRIPTION

Figure 1:
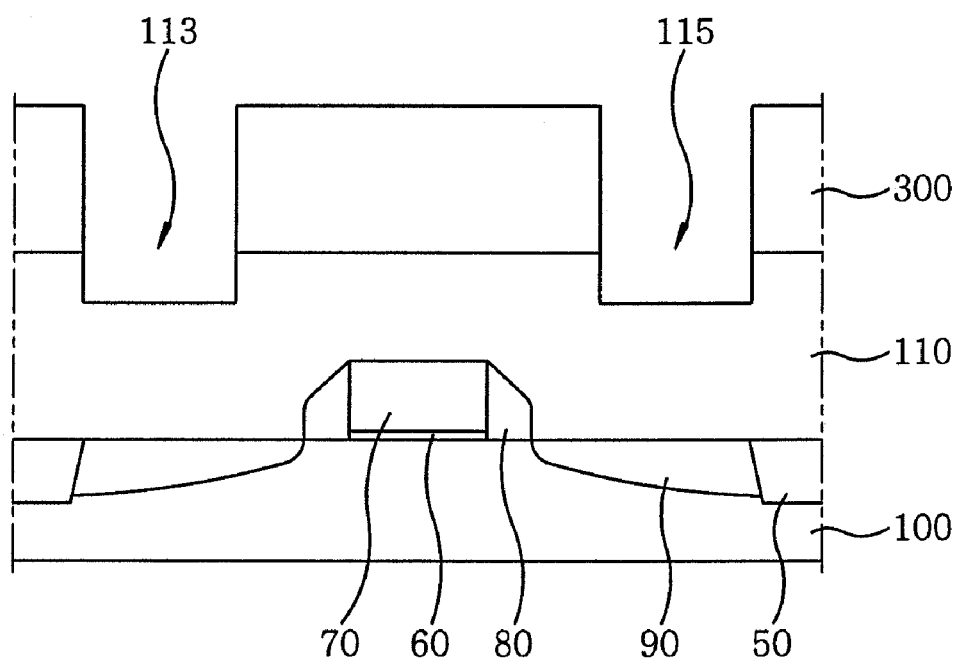
FIGS. 1 to 5 are cross sectional views illustrating a method for manufacturing a semiconductor device through a sequence of manufacturing processes.

In the drawings, in order to represent various layers and regions in a clear manner, their thicknesses are represented to be enlarged. Through the entire specification, like elements are designated by the same reference numerals. If a portion such as a layer, a film, a region or a plate is referred to be positioned on another portion, such an expression may incorporate a case in which there exists still another portion therebetween as well as a case in which the portion is positioned right on said another portion. On the contrary, if a portion is referred to be positioned right on another portion, it means that there is no still another portion therebetween.

First, as shown in FIG. 1, a gate insulation film 60 and a gate electrode 70 are sequentially formed over a semiconductor substrate 100 on which a device isolation film 50 may be formed.

A spacer 80 may be formed over side surfaces of the gate insulation film 60 and the gate electrode 70. The spacer 80 may be used as an electrical barrier between neighboring gate electrodes 70.

Subsequently, highly concentrated impurity ions may be injected into that portion of semiconductor substrate 100 not covered with the spacers 80 and the gate electrode 70 to thereby form high concentration junction regions 90 on the exposed semiconductor substrate 100.

Then, an insulation film 110 may be formed over the semiconductor substrate 100, the spacer 80 and the gate electrode 70, and a trench pattern 300 may be formed over the insulation film 110 by using a photoresist film patterned by a photo mask.

Next, the insulation film 110 is etched using the trench pattern 300 as a mask so that trenches 113 and 115 may be formed.

Figure 2:
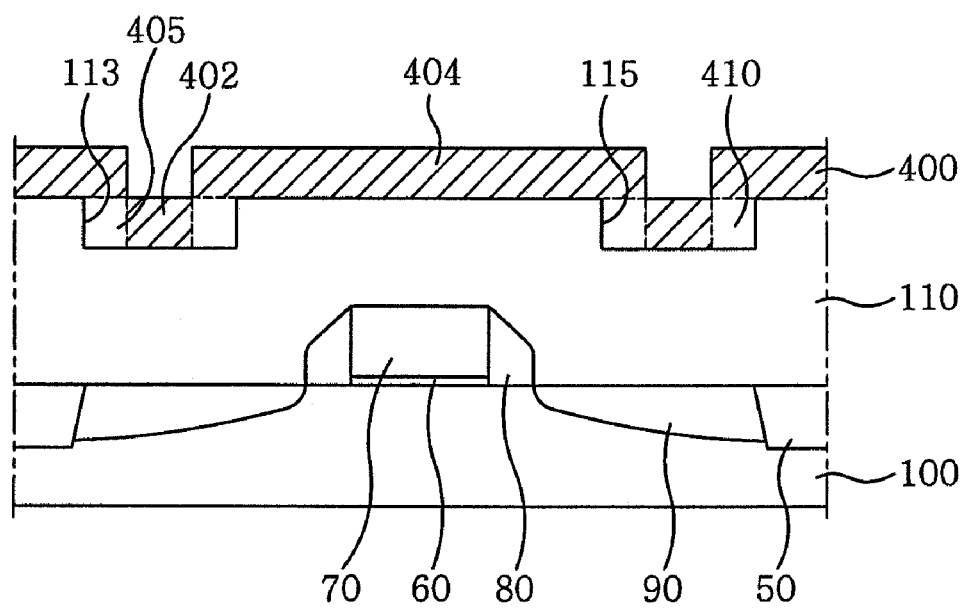

Afterwards, as shown in FIG. 2, a spacer film 400 is formed over the insulation film 110 and trenches 113 and 115. The spacer film 400 may be one of silicon oxide and silicon nitride.

Figure 3:
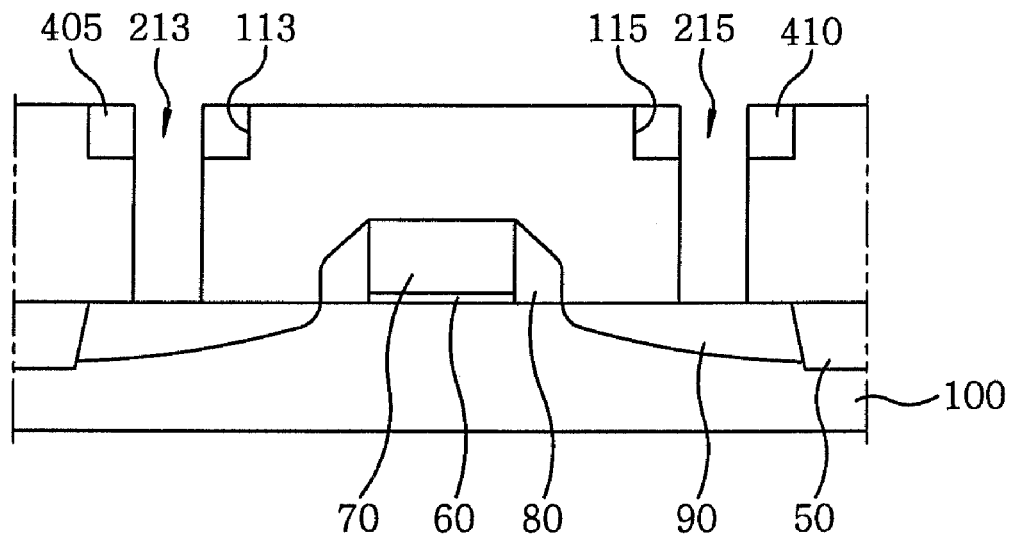

Subsequently, a blanket etching process is used to etch the spacer film 400. At this time, an etching process is used to remove hatched portions 402 and 404 of the spacer film 400 but leaving spacers 405 and 410 (see FIG. 2—the portions of 400 represented with hatch marks are the portions etched away; the portions of 400 represented without hatch marks (i.e., solid) are not etched at this point). The spacers 405 and 410 contact the lower surface and a sidewall of the trench 113 and a lower surface and a sidewall of the trench 115 respectively. Then, as shown in FIG. 3, the insulation film is etched by using the spacers 405 and 410 as a mask so that via holes 213 and 215 for exposing portions of the high concentration junction regions 90 of the semiconductor substrate 100 may be formed.

Since the trenches 113 and 115 are formed before the via holes 213 and 215 are formed, the process for removing the photoresist film from the via holes need not be performed during a photoresist rework process. Accordingly, since a critical dimension distortion phenomenon caused by residues of the photoresist film is remedied, the via holes 213 and 215 may be formed in their desired patterns, respectively.

Although two photolithography process steps have been required to form the via holes and the trenches, the spacers 405 and 410 may be used as a mask to form the via holes 213 and 215 in accordance with embodiments, so that the photolithography process may be required only once to form the trenches 113 and 115, thereby reducing manufacturing costs and simplifying the manufacturing process.

Figure 4:
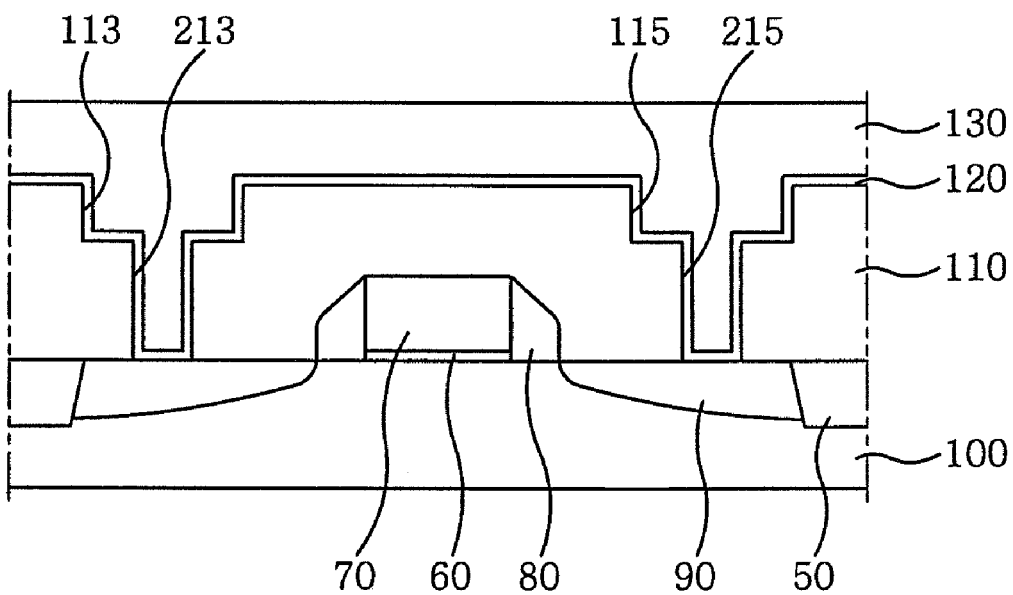

Subsequently, as shown in FIG. 4, the spacers 405 and 410 are removed through a wet etching process by using $H_3PO_4$; a barrier metal layer 120 is formed over the exposed semiconductor substrate 100 and the insulation film 110, on which the trenches 113 and 115 and the via holes 213 and 215 are provided; and then a metal film 130 may be formed over the barrier metal layer 120.

Figure 5:
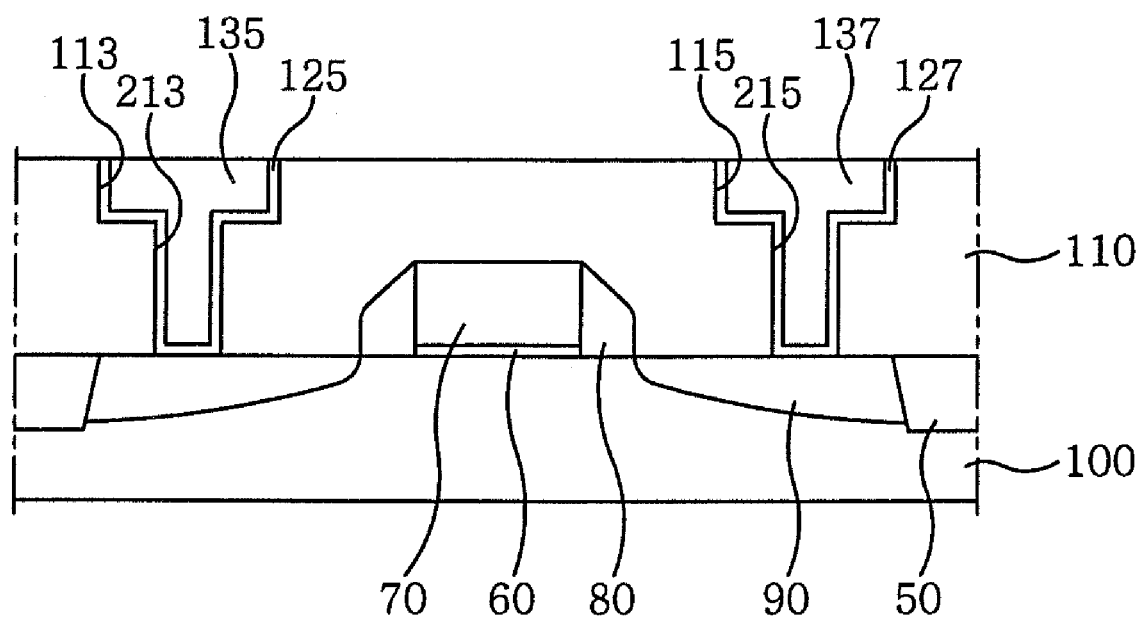

Then, as shown in FIG. 5, a chemical mechanical polishing (CMP) process planarizes the metal film 130 and the barrier metal layer 120, so that metal lines 135 and 137 may be formed. The barrier metal layer 120 remains to form barrier metal films 125 and 127 only over sidewalls of the trenches 113 and 115 and sidewall of the via holes 213 and 215.

In accordance with embodiments, the insulation film is etched by using the trench pattern made by the photoresist film as a mask to form the trenches, and another insulation film is etched by using the spacer as another mask to form the via holes. Thus, the photolithography process which may have been performed twice may be performed only once, thereby simplifying the manufacturing process and reducing the manufacturing costs.

Also, if the trench-first process is employed, the process for removing the photoresist film with which the via holes are filled need not be performed during the photoresist rework process. Accordingly, the critical dimension distortion phenomenon caused by the residues of the photoresist film does not occur. The electrical characteristics and the reliability of the semiconductor device may be improved, thereby improving the yield of the products.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. A method of manufacturing a semiconductor device comprising:
    forming a gate electrode over a semiconductor substrate having a device isolation film formed thereon;
    forming a lower spacer film on sidewalls of the gate electrode;
    forming a high concentration junction region on the semiconductor substrate laterally between the device isolation film and the gate electrode;
    forming a first insulation film over the semiconductor substrate including the gate electrode, the lower spacer film and the high concentration junction region;
    forming a trench in the first insulation film;
    forming an upper spacer film over and directly contacting the uppermost surface of the first insulation film and the trench;
    selectively etching the upper spacer film to form upper spacers on sidewalls of the trench; and then
    etching a via in the first insulation film using the upper spacers as etch masks to thereby expose the high concentration junction region.

2. The method of claim 1, wherein the semiconductor substrate comprises a conductive layer.

3. The method of claim 1, wherein the trench is formed using a photoresist trench pattern as an etch mask.

4. The method of claim 1, wherein etching the spacer film comprises using a blanket etching process.

5. The method of claim 1, further comprising substantially removing all of the upper spacers after etching the via hole.

6. The method of claim 5, wherein said substantially removing all of the upper spacers comprises using $H_3PO_4$ to substantially remove all of the spacers.

7. The method of claim 1, further comprising forming a barrier film over sidewalls of the trench and the via hole.

8. The method of claim 7, further comprising depositing conductive material over the barrier film in the via hole and the trench.

9. The method of claim 1, wherein the spacer film comprises at least one of silicon oxide and silicon nitride.

10. A method comprising:
    forming a gate electrode over a semiconductor substrate;
    forming a lower spacer film on sidewalls of the gate electrode;
    forming a high concentration junction region on the semiconductor substrate;
    forming a first insulation film over the semiconductor substrate, the lower spacer and the gate electrode;
    forming a photoresist pattern on and directly contacting the first insulation film;
    forming a trench in the first insulation film corresponding spatially to the high concentration injunction region by performing a first etching process on the first insulation film using the photoresist pattern as a mask;
    forming a second insulating film over the first insulation film and the trench;
    forming upper spacers composed of the second insulating film contacting the lower surface and sidewalls of the trench by performing a second etching process on the second insulating film;
    forming a via hole extending through the first insulating film and exposing the high concentration junction region by performing a third etching process on the first insulating film using the upper spacers as masks;
    forming a first metal layer on sidewalls of the trench and the via hole and on the high concentration junction region; and then
    forming a second metal layer over the fist metal layer filing the trench and the via hole.

11. The method of claim 10, wherein the second insulating film comprises silicon oxide.

* * * * *